United States Patent [19]

Heise

[11] 4,360,790

[45] Nov. 23, 1982

[54] VARACTOR CONTROLLED PUSH-PULL OSCILLATOR

[75] Inventor: Rüdolf Heise, Wolfratshausen, Fed. Rep. of Germany

[73] Assignee: Siemens Aktiengesellschaft, Berlin & Munich, Fed. Rep. of Germany

[21] Appl. No.: 132,114

[22] Filed: Mar. 20, 1980

[30] Foreign Application Priority Data

Apr. 12, 1979 [DE] Fed. Rep. of Germany ....... 2915134

[51] Int. Cl.³ .............................................. H03B 5/12
[52] U.S. Cl. .................................... 331/114; 329/122;
 331/36 C; 331/117 R; 331/177 V; 332/30 V
[58] Field of Search ................. 331/36 C, 114, 117 R,
 331/177 V; 329/122, 124; 332/30 V

[56] References Cited

U.S. PATENT DOCUMENTS

| | | | |
|---|---|---|---|
| 3,020,493 | 2/1962 | Carroll | 331/114 X |
| 3,397,365 | 8/1968 | Kruse, Jr. et al. | 331/177 V X |
| 3,544,919 | 12/1970 | Stratman | 331/36 C X |
| 4,003,004 | 1/1977 | Fletcher et al. | 332/30 V |

OTHER PUBLICATIONS

Chow, "Transistor Circuit Engineering", John Wiley & Sons, New York, London, 1957, pp. 221-244.

*Primary Examiner*—Siegfried H. Grimm

*Attorney, Agent, or Firm*—Hill, Van Santen, Steadman, Chiara & Simpson

[57] ABSTRACT

An oscillator arrangement is disclosed which is controllable in its frequency and which comprises a control input for frequency variation and a transformer output, whose frequency-determining oscillating circuit possesses, as a controllable reactive element, two varactor diodes which are connected in opposing fashion and whose capacitance largely represents the oscillating circuit capacitance. Two feedback oscillator circuits are combined to form a push-pull circuit in that the output terminals of the oscillator circuits are connected in respect of d.c. to a reference potential by way of a central tap of the primary winding of a common output transformer. In addition, the two varactor diodes are oppositely poled and interconnected in respect of d.c. by way of the opposite terminals of an oscillating circuit inductance and, at their opposite terminals, are each connected to respective bases of transistors of two oscillator circuits, the emitters of the transistors being connected together and by way of respective resistors to a power supply and the collectors being connected together by way of opposite terminals of the primary winding of the output transformer. In order to form the control input, the oscillating circuit inductance is provided with a central tap.

14 Claims, 3 Drawing Figures

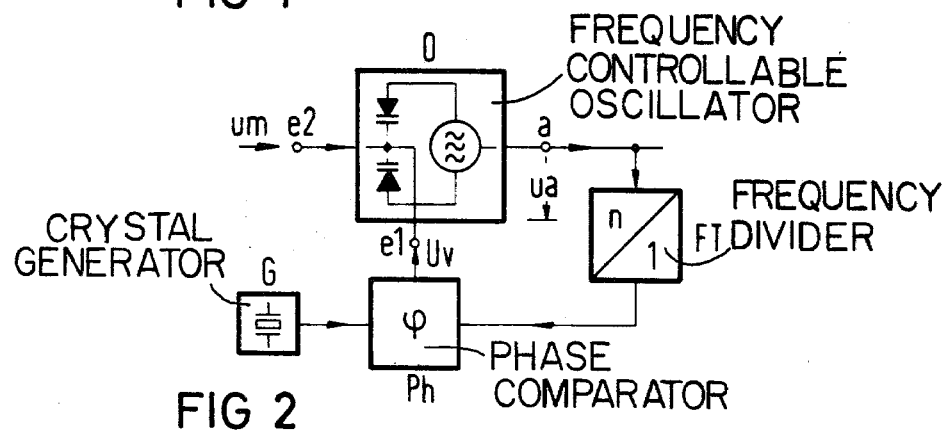
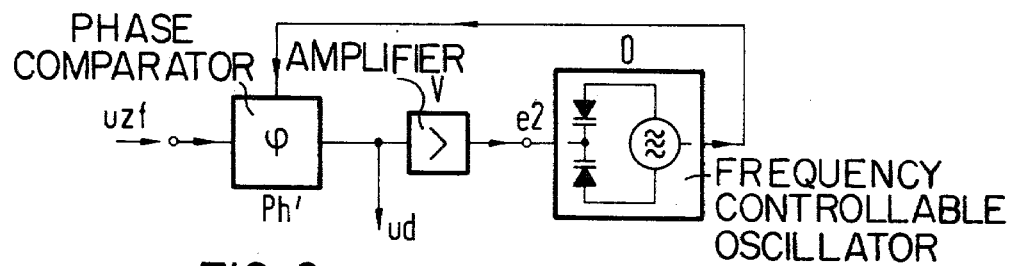
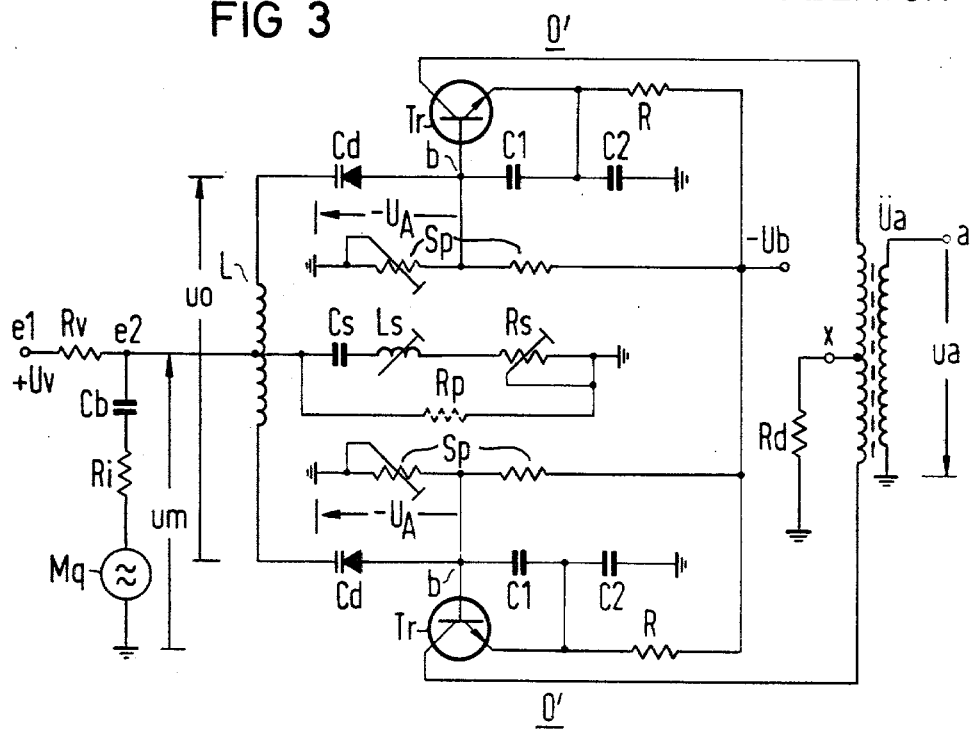

VARACTOR CONTROLLED PUSH-PULL OSCILLATOR

BACKGROUND OF THE INVENTION

1. Field of the Invention

The present invention relates to an oscillator arrangement, and particularly to an oscillator arrangement which is controllable in its frequency, having a control input for a frequency variation, and a transformer output whose frequency-determining oscillating circuit has, as a controllable reactive element, two varactor diodes which are connected in opposing fashion and whose capacitance substantially represents the oscillating circuit capacitance.

2. Description of the Prior Art

Oscillator arrangements of the type generally set forth above can be used for purposes of frequency modulation or demodulation. In view of the non-linear properties of varactor diodes, it is known, for example through the publication "Nachrichtetechnische Zeitschrift" 1965, Vol. 4, pp. 186-190, to use two varactor diodes connected in opposing fashion in place of a single varactor diode. The linear modulation range of the frequency variation can be additionally optimized by providing that the overall capacitance of the two varactor diodes is clipped to the least extent possible by additional capacitances, and therefore fundamentally represents the capacitive reactive element of the frequency-determining oscillating circuit of the oscillator.

If high requirements are made on the linearity of the frequency variation range, in dependence upon a control voltage, even if the described linearization measures are taken into consideration, only a relatively small linear frequency variation range of approximately ±3% of the generated fundamental oscillation can be achieved.

As described in the publication cited above, these difficulties can be countered by using two oscillators of very high oscillating frequencies, whose oscillating frequencies are displaced relative to one another by the amount of the desired intermediate frequency and are mixed together to form the intermediate frequency. If one of these two oscillators is frequency-modulated, and in fact in the limits governed by the linearity requirements, in this manner the modulation bandwidth can be enlarged by the quantity of the frequency conversion factor.

SUMMARY OF THE INVENTION

The object of the present invention is to provide, in a frequency-modulatable oscillator arrangement, a further solution which, dispensing with frequency conversion, and at a relatively low technical expense, permits a wide-band frequency variation which satisfies high linearity requirements.

Beginning with a frequency-controllable oscillator arrangement of the type generally mentioned above, the above object is realized in accordance with the invention and that two feedback oscillator circuits are combined to form a push-pull circuit arrangement in that the output terminals of the feedback oscillator circuits are connected in respect of d.c. to a reference potential by way of a central tap of the primary winding of a common output transformer. Moreover, two varactor diodes are interconnected in respect of d.c. by way of the oscillating circuit inductance and at their opposite terminals are each connected to one of the two feedback oscillator circuits, and the oscillating circuit inductance is provided with a central tap which forms the control input.

The present invention is based on the recognition that a push-pull circuit comprising two feedback oscillator circuits can produce an oscillator arrangement which can be linearly modulated in its frequency over a wide band, and, in fact, for two reasons. On the one hand, the frequency determining circuit can be designed in such a manner that the capacitances of the varactor diodes are cut only to a slight extent by additional series or parallel capacitors, since the coupling capacitors used in the feedback oscillator circuits can be selected to be very large. On the other hand, the fact that the push-pull principle is used mean that the modulation control source can be substantially decoupled from the generated fundamental oscillation. To this may be added the fact that in the arrangement corresponding to the present invention the modulation control source can produce the modulation control signal with a low internal impedance, which means that the modulation control signal is well suited to high modulation frequencies. Here, the cut-off frequency of the modulation range is derived from the internal impedance of the modulation control source and the capacitance of two parallel-connected varactor diodes.

In a preferred embodiment of the invention, each of the two feedback oscillator circuits possesses a transistor whose emitter is connected in respect of a.c. to its base by way of a first coupling capacitor and to a reference potential by way of a second coupling capacitor, and whose base also forms the terminal point for a varactor diode and the tap of a voltage divider for the operating point voltage.

According to another feature of the invention, the central tap of the oscillating circuit inductance is connected to a reference potential by way of an absorption wave trap composed of a series inductance, a series capacitance, and a series resistance. In this case, the resonance frequency of the absorption wave trap exceeds twice the middle frequency of the variation range of the frequency determining oscillating circuit, and the resistor, which comprises the internal impedance of the control voltage source, is at least five times smaller than the surge impedance of the absorption wave trap. In this manner, the highly linear modulation of the frequency of the oscillator arrangement amounting to ±5% of the generated fundamental oscillation can be extended to ±8%. One of the factors which allows this outstanding result to be achieved is that, here, the compensation of non-linear effects is carried out by way of the first harmonic which, in the push-pull circuit, is largely decoupled from the fundamental wave.

BRIEF DESCRIPTION OF THE DRAWINGS

Other objects, features and advantages of the invention will be best understood from the following detailed description, taken in conjunction with the accompanying drawing, on which:

FIG. 1 is a schematic representation of a frequency modulator employing a frequency-controllable oscillator;

FIG. 2 is a basic schematic diagram of a frequency demodulator which employs a frequency-controllable oscillator; and FIG. 3 is a schematic circuit diagram of a frequency-controllable oscillator corresponding to the present invention which can be used in the circuits illustrated in FIGS. 1 and 2.

DESCRIPTION OF THE PREFERRED EMBODIMENTS

As is illustrated in FIG. 1, a frequency-controllable oscillator O comprises varactor diodes connected in opposing fashion and has two inputs e1 and e2. The control input e1 supplies a regulating voltage Uv which has a relatively high time constant and links the generated fundamental oscillation by means of a phase regulating loop to a reference oscillation, which here is produced by a quartz or crystal generator G. The regulating loop itself comprises a frequency divider FT and a phase comparator Ph. By means of the frequency divider FT, the oscillator oscillation of the voltage ua is provided at an output a of the oscillator O and is divided in frequency by a factor n to the frequency of the quartz generator G, and is compared with the reference oscillation in the phase comparator Ph. The result of the comparison acts in the form of the aforementioned regulating voltage Uv on the frequency determining circuit of the oscillator O. By way of the input e2, the oscillator is supplied with the actual modulation voltage um. The modulation voltage um likewise controls the varactor diodes, which are connected in opposing fashion, in a like manner.

As can be seen from FIG. 2, a controllable oscillator O of this general type can also be used for demodulation purposes. In FIG. 2, the frequency-controllable oscillator is, in each case, brought by way of a regulating loop to the frequency of the incoming intermediate frequency signal uzf which is to be demodulated. For this purpose, the output signal of the oscillator O present at the output a is fed to a first input of a phase comparator Ph at whose second input a signal uzf which is to be demodulated is present. The regulating voltage which results from the comparison and is present at the output of the phase comparator Ph here represents the demodulated signal ud. This signal is fed by way of an amplifier V to an input e2 of the oscillator O. In contrast to the phase regulating loop of the modulator illustrated in FIG. 1, the phase regulating loop which is used for demodulation purposes is designed to be such that it is able to follow the change in the incoming intermediate frequency signal uzf which is to be demodulated.

FIG. 3 illustrates a frequency-controllable oscillator circuit corresponding to that of the present invention which can be used in the circuits in FIGS. 1 and 2. It comprises two feedback oscillator circuits O' which are connected in a push-pull manner. Each of these three-terminal circuits comprises a transistor Tr whose emitter is connected by way of a coupling capacitor C1 to the base, and by way of a coupling capacitor C2 to a reference potential. The negative operating d.c. voltage −Ub is fed to the emitters of the transistors Tr by way of a resistor R and to their bases at a terminal point b by way of a tap of a voltage divider SP. The frequency-determining oscillating circuit which is common to the ECO oscillator three-terminal circuits comprises the oscillating circuit inductance L by way of which the two varactor diodes Cd are connected in opposing fashion. The control input e2 is connected to a central tap of the oscillating circuit inductance L. The varactor diodes Cd are connected by their second terminals to the terminal point b. The coupling capacitors C1 and C2 have a very high value in comparison to the capacitance of the varactor diodes Cd, so that the varactor capacitance virtually represent the capacitive reactive element of the frequency-determining oscillating circuit. The output of the frequency-controllable oscillator illustrated in FIG. 3 is formed by an output transformer Üa from whose secondary winding, at the terminal a, an output voltage ua is withdrawn relative to the reference potential. The terminals of the primary winding of the output transformer Üa are connected to the collector terminals of the transistors Tr. The central tap x of the primary winding is connected to the reference potential by way of a resistor Rd. The modulation voltage um which is fed to the control input e2 is produced by the modulation source Mq which has an internal impedance Ri, and is fed to the control input e2 by way of a coupling capacitor Cb. The control input e1 is formed in that the series resistor Rv is provided between the input and the control input e2. Extending from the central tap of the oscillating circuit inductance L, in the direction of the reference potential, is an absorption wave trap composed of a series capacitance Cs, an adjustable series inductance Ls, and an adjustable series resistance Rs. The absorption wave trap is also connected in parallel to a resistor Rp which has a value equal to the internal impedance Ri of the modulation source Mq.

As a result of the push-pull principle which is employed in the circuit of FIG. 3, the fundamental oscillation which occurs at the output a in the form of the output voltage ua, is largely decoupled from the first harmonic. The decoupling of the transistors Tr by means of the coupling capacitors C1 and C2 means that the efficiency of the frequency-determining oscillating circuit is fundamentally governed by the quality of the capacitance diodes. Because of the large oscillation build-up gradient of this circuit principle, the oscillating amplitude can be advantageously reduced so that the high-frequency diode operation is kept low. Without the absorption wave trap illustrated in FIG. 3, in a circuit of this kind operating with an oscillator middle frequency of 70 MHz, a linear gradient curve (with a gradient distortion $\leq 0.5\%$) of $\pm 5\%$ can be achieved corresponding to a carrier deviation of $\pm 3.5\%$ MHz.

In a further development of the invention, the push-pull oscillator constructed in accordance with the present invention can be extended by means of its harmonic properties in the linear gradient range by virtue of the aforementioned absorption wave trap. Here, the absorption wave trap is tuned to a resonant frequency exceeding twice the oscillator middle frequency of the fundamental oscillation, and, in conjunction with the parallel-connected resistor Rp, which here is at least five times smaller in value than the surge impedance of the absorption wave trap, produces a capactive reactive component which reduces in the direction of its resonance. This property is manifest by way of the coupling of the currents of the fundamental wave and the harmonic in the form of the desired increase in the linear gradient curve. In this respect, it is advantageous that the absorption wave trap is decoupled from the fundamental wave because, on account of the push-pull principle, only harmonic currents flow from the central tap of the oscillating circuit inductance L towards the reference potential.

Through addition of further absorption wave traps tuned to resonant frequencies lower and/or higher than twice of the fundamental oscillator middle frequency the linear gradient range may still be more increased.

In respect of the aforementioned exemplary embodiment, with an oscillator middle frequency of 70 MHz and a permissible gradient distortion ≦0.5%, the use of the described absorption wave trap results in a linear gradient curve of ±8%. corresponding to a carrier deviation of ±5.6 MHz. The resistor Rp which is connected in parallel to the absorption wave trap can virtually be freely selected if the modulation source Mq is designed for a negligible internal impedance, which is basically possible because of the low-ohmic operation which can occur.

As can also be seen from FIG. 3, the voltage dividers Sp are designed to be adjustable. As a result, the operating point of the transistors Tr, which is determined by the collector-emitter voltage, can be set to be such that even when AM limitation is in effect, no increase occurs in the harmonic content.

Although I have described my invention by reference to particular illustrative embodiments thereof, many changes and modifications of the invention may become apparent to those skilled in the art without departing from the spirit and scope of the invention. I therefore intend to include within the patent warranted hereon all such changes and modifications as may reasonably and properly be included within the scope of my contribution to the art.

I claim:

1. An oscillator arrangement which is controllable in frequency, comprising:
   a frequency control input;
   a frequency-determining circuit including two varactor diodes connected in opposing fashion, the capacitance of said varactor diodes largely representing the oscillating circuit capacitance, and an inductance having first and second terminals connected to respective varactor diodes and a tap connected to said frequency control input;
   an output transformer including first and second terminals and a tap connected to a reference potential; and
   a pair of feedback oscillator circuits each including a first terminal connected to a respective varactor diode, a second terminal connected to a respective transformer terminal to provide push-pull operation, and an emitter terminal connected to the emitter terminal of the other.

2. The oscillator arrangement of claim 1, wherein each of said feedback oscillator circuits comprises:
   a transistor having a base, a collector and an emitter, said base connected to the respective varactor diode,
   first and second capacitors connected in series between said base and the reference potential to a.c. couple said emitter to said base; and
   a voltage divider including a tap connected to said base for establishing the operating point voltage.

3. The oscillator arrangement of claim 2, wherein said voltage divider comprises:
   an adjustable resistor for controlling the operating point voltage to limit the generated oscillation.

4. The oscillator arrangement of claim 1, comprising:
   a resistor connecting said tap of said transformer to the reference potential.

5. The oscillator arrangement of claim 1, and further comprising:
   a control voltage source connected to said frequency control input and having an internal resistance;
   an absorption wave trap comprising a capacitor, an inductor and a first resistor connected in series between said frequency control input and the reference potential, the resonant frequency of said absorption wave trap being more than twice the middle frequency of the frequency variation range; and
   a second resistor connected in parallel to said absorption wave trap and having a resistance equal to said internal resistance and at least five times smaller than the surge impedance of said absorption wave trap.

6. The oscillator arrangement of claim 5 wherein: said inductor is a variable inductor.

7. The oscillator arrangement of claim 5 wherein: said first resistor is a variable resistor.

8. An oscillator arrangement having controlled frequency, comprising:
   a frequency control input;
   a control voltage source connected to said frequency control input and having an internal resistance;
   an absorption wave trap connected to said frequency control input and to a reference potential, said absorption wave trap having a resonant frequency greater than twice the middle frequency of the frequency range;
   a first resistor connected in parallel to said absorption wave trap and having a resistance equal to said internal resistance and at least five times smaller than the surge impedance of said absorption wave trap;
   an inductor including a pair of terminals, and a tap connected to said frequency control input;
   an output transformer including a pair of terminals, and a tap;
   a second resistor connecting said transformer tap to the reference potential;
   a pair of transistors each including a base, an emitter and a collector, said collectors connected to respective terminals of said output transformer;
   third and fourth resistors connecting respective emitters to an operating potential;
   first and second capacitors connected in series between said base of one of said transistors and the reference potential, said emitter of said transistor connected to the junction of said series-connected capacitors to a. c. couple to said base to its respective emitter, and third and fourth capacitors connected in series between said base of the other of said transistors and the reference potential, said emitter of said transistor connected to the junction of said series-connected capacitors, to a.c. couple said base to its respective emitter;
   a pair of voltage dividers connected to respective ones of said bases for establishing the operating points; and
   a pair of varactor diodes connected in opposing fashion between respective ones of said bases and respective ones of said inductor terminals to form oscillating circuits.

9. The oscillator arrangement of claim 8, wherein said absorption wave trap comprises:
   a capacitor, a second inductor and a fifth resistor connected in series.

10. The oscillator arrangement of claim 9, wherein: said second inductor is a variable inductor.

11. The oscillator arrangement of claim 9, wherein: said fifth resistor is a variable resistor.

12. The oscillator arrangement of claim 9, wherein: said second inductor is a variable inductor and said fifth resistor is a variable resistor.

13. The oscillator arrangement of claim 8, wherein each of said voltage dividers comprises:
   a variable resistor.
14. The oscillator arrangement of claim 8, wherein:
   said absorption wave trap comprises a capacitor, a variable inductor and a variable resistor connected in series; and
   each of said voltage dividers comprises a fixed resistor and a variable resistor.

* * * * *